United States Patent
Ha

(10) Patent No.: US 7,557,403 B2
(45) Date of Patent: *Jul. 7, 2009

(54) DOUBLE GATE TRANSISTORS HAVING AT LEAST TWO POLYSILICON PATTERNS ON A THIN BODY USED AS ACTIVE REGION AND METHODS OF FORMING THE SAME

(75) Inventor: Dae-Won Ha, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 299 days.

This patent is subject to a terminal disclaimer.

(21) Appl. No.: 11/379,432

(22) Filed: Apr. 20, 2006

(65) Prior Publication Data

US 2006/0240621 A1    Oct. 26, 2006

(30) Foreign Application Priority Data

Apr. 21, 2005    (KR) ............................... 2005-33257

(51) Int. Cl.
   *H01L 29/788* (2006.01)
(52) U.S. Cl. ................................ 257/315; 257/E29.155
(58) Field of Classification Search ................ 257/315, 257/E29.155
   See application file for complete search history.

(56) References Cited

U.S. PATENT DOCUMENTS

| 5,441,904 | A  | * | 8/1995 | Kim et al. ................... 438/592 |
| 6,150,251 | A  | * | 11/2000 | Yew et al. ................... 438/592 |
| 6,181,050 | B1 | * | 1/2001 | Taussig et al. ............... 310/309 |
| 6,200,856 | B1 | * | 3/2001 | Chen ........................... 438/257 |
| 6,411,589 | B1 | * | 6/2002 | Hoen et al. ................... 369/126 |
| 6,865,117 | B2 | * | 3/2005 | Kozicki ..................... 365/189.09 |
| 6,893,948 | B2 | * | 5/2005 | Ballantine et al. ........... 438/585 |
| 2002/0149064 | A1 | * | 10/2002 | Ballantine et al. ........... 257/385 |
| 2004/0023476 | A1 | * | 2/2004 | Ballantine et al. ........... 438/585 |
| 2004/0256647 | A1 |   | 12/2004 | Lee et al. |
| 2005/0029583 | A1 |   | 2/2005 | Popp et al. |
| 2005/0110096 | A1 | * | 5/2005 | Ballantine et al. ........... 257/369 |
| 2006/0029887 | A1 | * | 2/2006 | Oh et al. ..................... 430/311 |

FOREIGN PATENT DOCUMENTS

KR    2005-0001165    1/2005

OTHER PUBLICATIONS

English language abstract of Korean Publication No. 2005-0001165.

* cited by examiner

*Primary Examiner*—Charles D. Garber
*Assistant Examiner*—Stanetta D Isaac
(74) *Attorney, Agent, or Firm*—Marger Johnson & McCollom, P.C.

(57) ABSTRACT

Double gate transistors having at least two polysilicon patterns on a thin body used as an active region and methods of forming the same are provided. Embodiments of the transistors and methods provided are capable of enhancing current drivability of a semiconductor memory device using polysilicon patterns having different impurity concentrations from each other. In some embodiments an active region is protruded from a semiconductor substrate, an impurity diffusion region is formed in the active region, and a gate insulating pattern and a gate pattern are sequentially stacked on the active region. In these embodiments, the gate pattern may include polysilicon patterns having different impurity concentrations from each other.

10 Claims, 15 Drawing Sheets

DOUBLE GATE TRANSISTORS HAVING AT LEAST TWO POLYSILICON PATTERNS ON A THIN BODY USED AS ACTIVE REGION AND METHODS OF FORMING THE SAME

CROSS-REFERENCE TO RELATED APPLICATION

This patent application claims priority from Korean Patent Application No. 10-2005-33257, filed Apr. 21, 2005, the contents of which are hereby incorporated by reference in their entirety.

BACKGROUND

1. Field of the Invention

The present invention relates to transistors of a semiconductor memory device and methods of forming the same, and more particularly, to double gate transistors having at least two polysilicon patterns on a thin body used as an active region and methods of forming the same.

2. Description of the Related Art

In recent years, semiconductor memory devices have been fabricated using transistors having vertical channels instead of transistors having horizontal channels to increase the integration density of the transistors. The transistors having vertical channels are driven using a three-dimensional field effect resulting from the sidewall and the top surface of an active region being protruded from a semiconductor substrate. The active region protruded from the semiconductor substrate may be referred to as the active region of a thin body in the transistor having a vertical channel. In contrast, the transistor having horizontal channel may be driven using a two-dimensional field effect resulting only from the top surface of the active region of the semiconductor substrate. The transistor having horizontal channel does not use a sidewall of the active region due to its structure. Accordingly, the transistor having a vertical channel can have an increased channel length by using the sidewall of the active region as compared to the transistor having a horizontal channel. A resulting process margin in the transistor having a vertical channel is increased as compared to the transistor having a horizontal channel because width of the top surface of the active region in the transistor having a vertical channel can be smaller than the transistor having a horizontal channel. Accordingly, the transistor having a vertical channel can have a smaller interval between adjacent active regions, and may thus be able to increase the integration density of the semiconductor memory devices as compared to the transistor having a horizontal channel.

However, when the integration density of the semiconductor memory device increases, the transistor having the vertical channel cannot keep the same threshold voltage as the transistor having the horizontal channel while having the same channel length and the channel width. This is because the transistor having the vertical channel must have a top surface width of the active region that is smaller in one direction in order to increase the integration density of the semiconductor memory device. This decrease in width of the top surface of the active region, in turn, decreases the thickness of the thin body which defines the active region of the transistor having the vertical channel in a three-dimensional manner. When the thickness of the thin body decreases, the transistor having the vertical channel brings junction depletions formed from the sidewall of the active region facing each other during its drive, which thus causes a short channel effect. Thus, transistors having vertical channels cannot easily have a desired threshold voltage due to the short channel effect.

In the meantime, U.S. Patent Publication No. 2005/0029583 to Martin Popp et. al. discloses a field effect transistor and a method for production thereof.

According to U.S. Patent Publication No. 2005/0029583, the transistor and the fabrication method include web-type active semiconductor regions, which are vertically connected in a semiconductor substrate. The active semiconductor regions have side surfaces and top surfaces. First and second gate oxide layers are formed on the side and top surfaces of the active semiconductor regions, respectively. First and second gate electrodes are formed on the first and second gate oxide layers, respectively. In this case, the first gate electrode is formed on the first gate oxide layer, and the second gate electrode is formed on the second gate oxide layer to cover the first gate electrode.

However, the first and second gate electrodes cannot completely fix the required decrease in the threshold voltage of the transistor due to the decrease in the widths of the active semiconductor regions. This is because the transistor brings junction depletions formed from side surfaces of the active region facing each other during its drive to cause the short channel effect. In order to prevent the short channel effect, impurity ions may be implanted in the active semiconductor regions. In this case, charge mobility in the transistor may be degraded due to the impurity ions during its drive.

SUMMARY

According to embodiments of the invention, there are provided double gate transistors having at least two polysilicon patterns on a thin body used as an active region and methods of forming the same.

Embodiments of the present invention provide a semiconductor device having at least two polysilicon patterns on a thin body used as an active region, semiconductor memory devices having the double gate transistor, and methods of forming the same.

In one embodiment, the semiconductor device includes an active region protruded from a semiconductor substrate and a gate pattern disposed on the active region. The gate pattern includes at least two polysilicon patterns stacked in sequence, where the polysilicon patterns may have different crystalline structures from each other. A gate insulating pattern may further be formed below the gate pattern, where the gate insulating pattern covers the top surface and a portion of the sidewall of the active region.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION

A double gate transistor and a semiconductor memory device according to the present invention will now be described in detail with reference to accompanying drawings.

Figure 1:
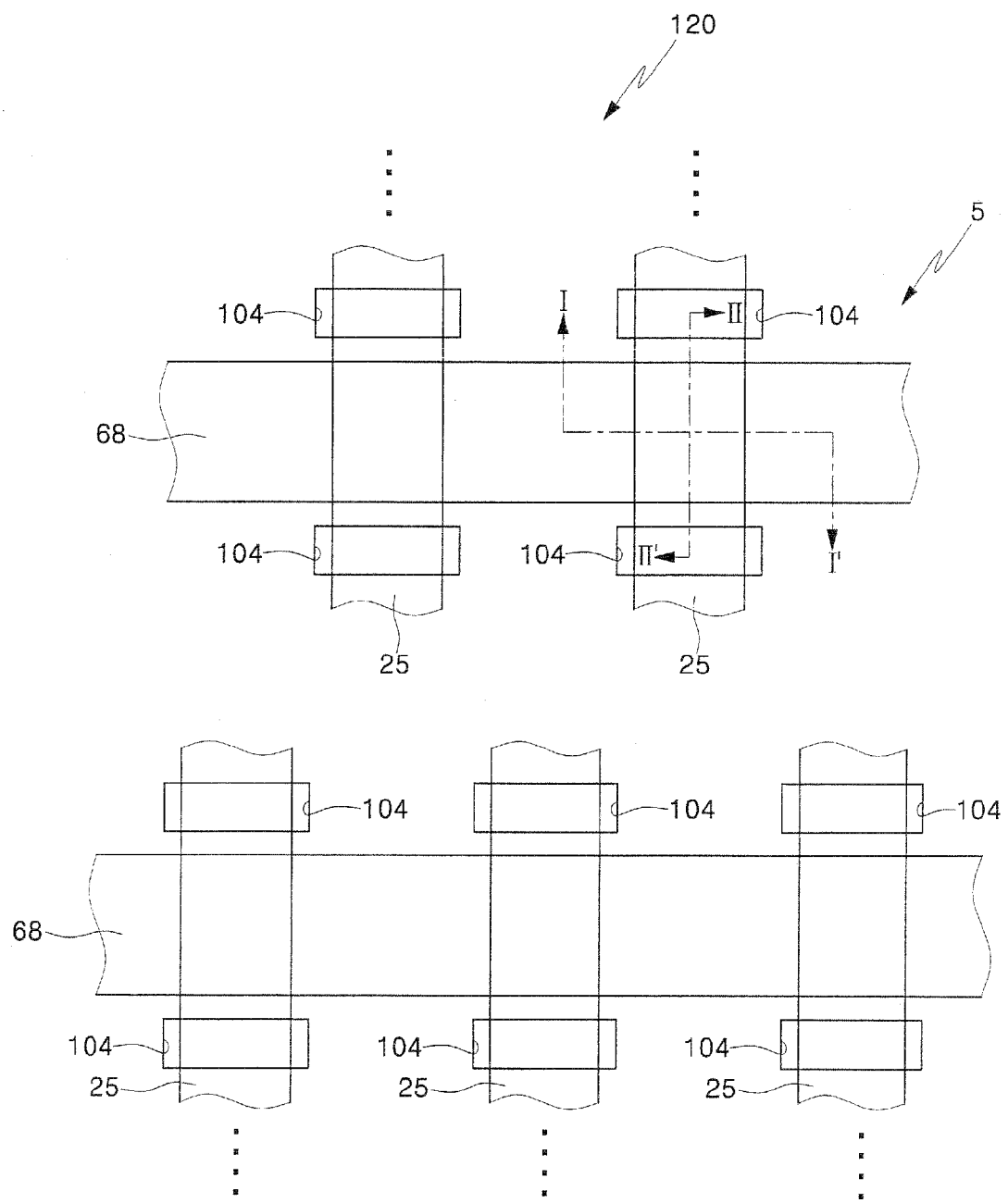
FIG. 1 is a layout view showing a semiconductor memory device in according to an embodiment of the present invention.
Figure 2:
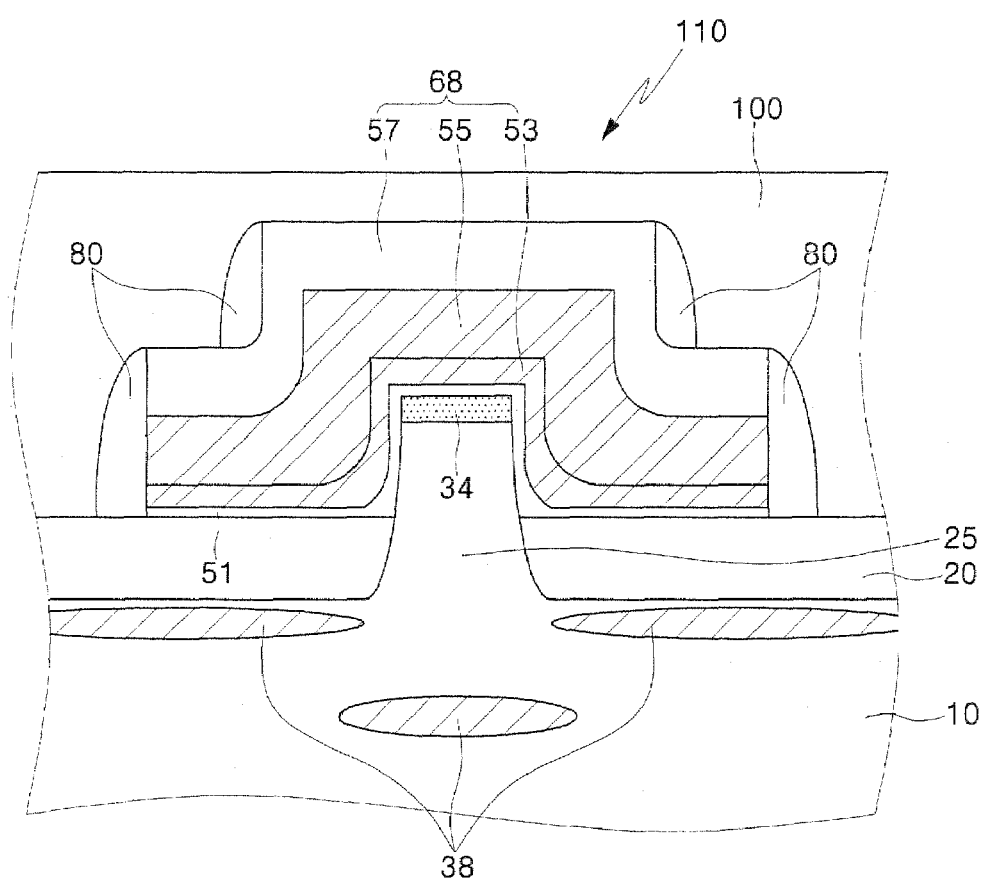
FIGS. 2 and 3 are cross-sectional views showing a transistor taken along lines I-I' and II-II' of FIG. 1, respectively.
Figure 3:
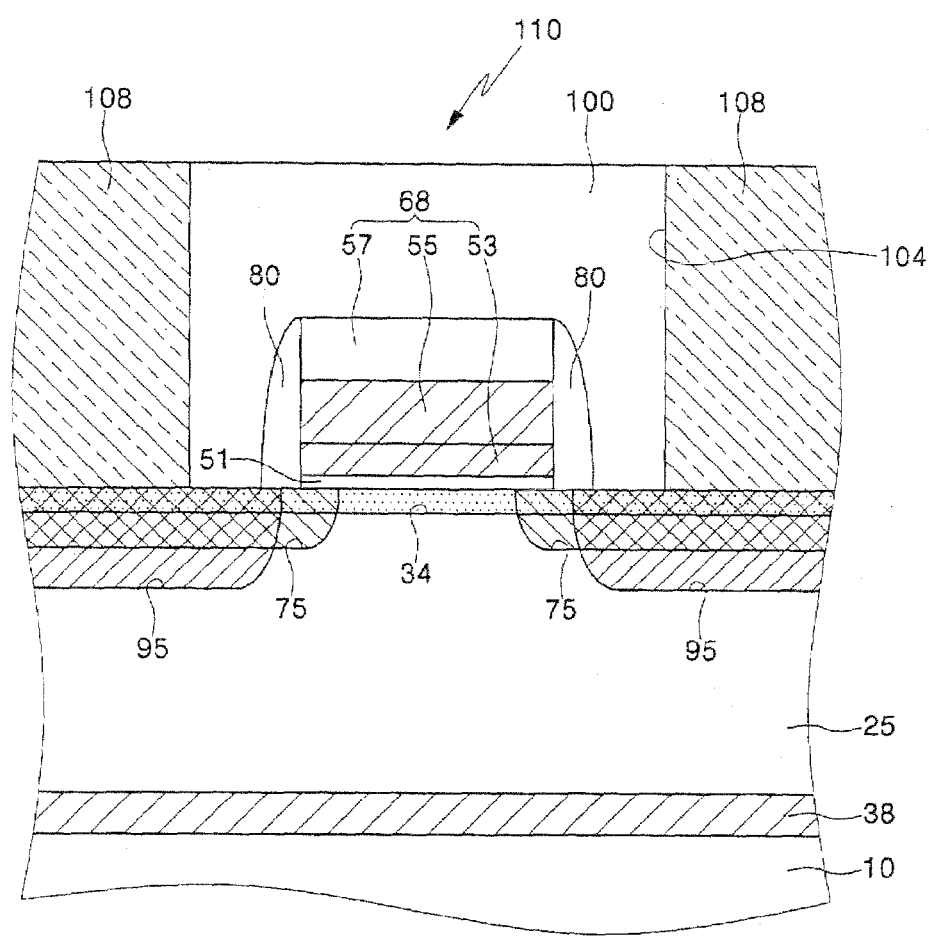

FIG. 1 is a layout view showing a semiconductor memory device in according to an embodiment of the present invention, and FIGS. 2 and 3 are cross-sectional views showing a transistor taken along lines I-I' and II-II' of FIG. 1, respectively.

Referring to FIGS. 1 to 3, a device isolation layer 20 is formed in a semiconductor substrate 10 having a cell array region 5. The device isolation layer 20 defines active regions 25. The device isolation layer 20 is preferably formed in the semiconductor substrate 10 to expose top surfaces and portions of sidewalls of the active regions 25. Accordingly, the top surfaces of the active regions 25 are higher than a top surface of the device isolation layer 20. The semiconductor substrate 10 may also include P type impurity ions.

Gate patterns 68 are formed on the active regions 25. The gate patterns 68 run across the active regions 25. Each of the gate patterns 68 may include polysilicon patterns 53 and 55, and a gate capping pattern 57, which may be sequentially stacked in the order listed. The gate capping pattern 57 may be formed of a silicon oxide ($SiO_2$) or a silicon nitride ($Si_3N_4$). The polysilicon patterns 53 and 55 may have different crystalline structures from each other. The polysilicon patterns 53 and 55 may also have different thicknesses from each other. Also, the polysilicon patterns 53 and 55 may preferably include P type impurity ions.

Gate insulating patterns 51 may be formed below the gate patterns 68, respectively. Each of the gate insulating patterns 51 is preferably formed of a silicon oxide ($SiO_2$) layer, a silicon oxynitride ($Si_xO_yN_z$) layer, or a silicon nitride ($Si_3N_4$) layer. The gate insulating patterns 51 cover the top surfaces and the portions of the sidewalls of the active regions 25.

The polysilicon patterns 53 and 55 of the gate patterns 68 may be formed in some embodiments as follows. Impurity concentrations of the polysilicon patterns 53 are preferably lower than those of the polysilicon patterns 55. In addition, the polysilicon patterns 53 preferably have an amorphous structure, while the polysilicon patterns 55 preferably have a crystalline structure.

Impurity diffusion regions 34 and 38 may be formed in the semiconductor substrate 10 below the device isolation layer 20 and in the active regions 25. The impurity diffusion regions 34 and 38 may have different impurity concentrations from each other. Impurity concentrations of an impurity diffusion region 34 formed in the active regions 25 is preferably lower than that of an impurity diffusion region 38 formed in the semiconductor substrate 10. Each of the impurity diffusion regions 34 and 38 has P type impurity ions. Impurity concentrations of the impurity diffusion regions 34 and 38 are preferably lower than those of the polysilicon patterns 53 and 55.

Gate spacers 80 may be formed on sidewalls of the gate patterns 68. The gate spacers 80 are preferably formed of a silicon nitride or a silicon oxide. First and second impurity regions 75 and 95 may overlap the gate patterns 68 and the gate spacers 80. The first and second impurity regions 75 and 95 may be implanted with N type impurity ions. The first and second impurity regions 75 and 95 may be structured to be the source and drain regions of a transistor.

An interlayer-insulating layer 100 may be formed on the semiconductor substrate 10 to cover the gate patterns 68 and the gate spacers 80. Contact nodes 108 may be formed through the interlayer-insulating layer 100 to be in contact with the first and second impurity regions 75 and 95. Accordingly, double gate transistors 110 including contact nodes 108, gate patterns 68, and first and second impurity regions 75 and 95 are formed in the semiconductor memory device 120.

Hereinafter, methods of forming a double gate transistor and a semiconductor memory device according to embodiments of the present invention will be described.

FIGS. 4, 6, 8, 10, 12, 14, 16, and 18 are cross-sectional views illustrating a method of forming a transistor taken along line I-I' of FIG. 1, and FIGS. 5, 7, 9, 11, 13, 15, 17, and 19 are cross-sectional views illustrating a method of forming a transistor taken along line II-II' of FIG. 1.

Figure 4:
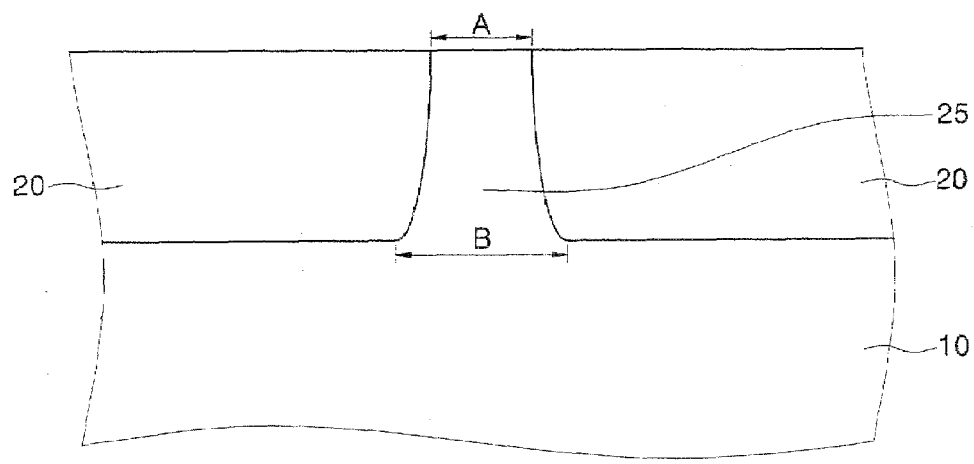
FIGS. 4, 6, 8, 10, 12, 14, 16, and 18 are cross-sectional views illustrating a method of forming a transistor taken along line I-I' of FIG. 1.
Figure 5:
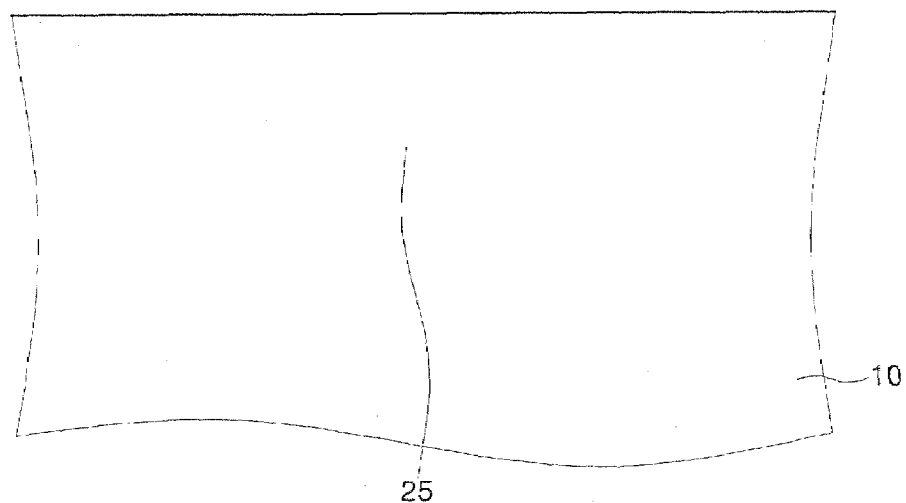
FIGS. 5, 7, 9, 11, 13, 15, 17, and 19 are cross-sectional views illustrating a method of forming a transistor taken along line II-II' of FIG. 1.

Referring to FIGS. 1, 4, and 5, a device isolation layer 20 is formed in a semiconductor substrate 10 of a cell array region 5. The device isolation layer 20 is formed in the semiconductor substrate 10 to isolate active regions 25. In this case, the device isolation layer 20 preferably exposes top surfaces of the active regions 25. Top and bottom widths A and B of each of the active regions 25 are preferably different from each other. That is, each of the active regions 25 may be preferably tapered such that the bottom width B is larger than the top width A. The semiconductor substrate 10 may also be implanted with P type impurity ions.

Figure 6:
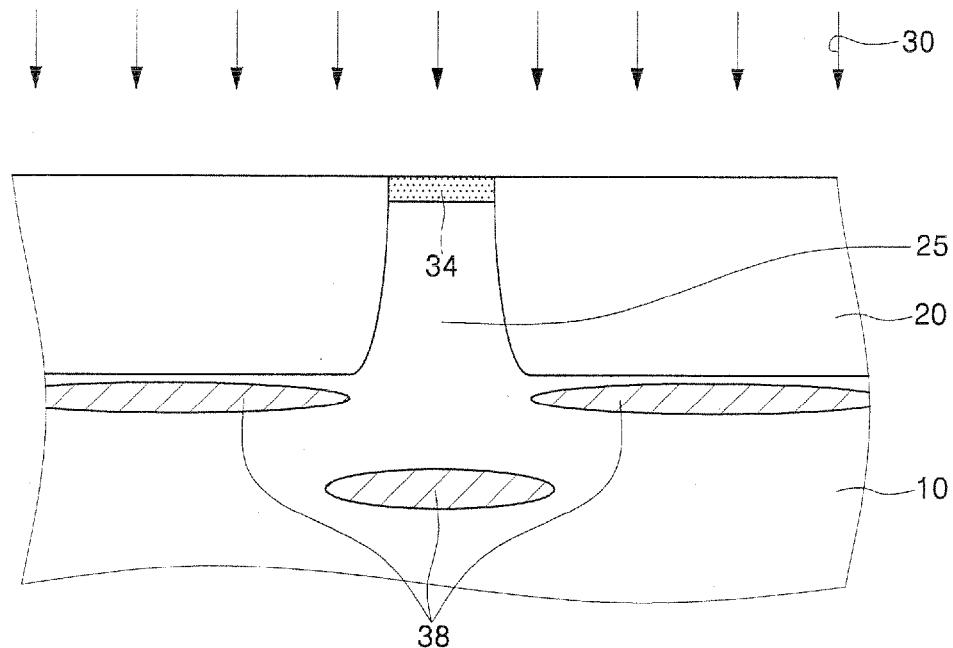
Figure 7:
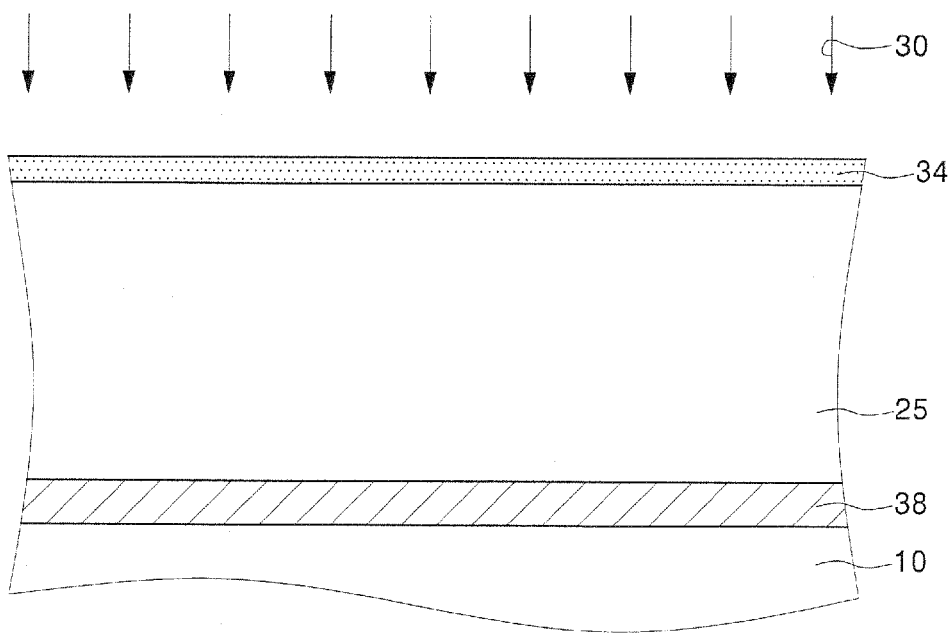

Referring to FIGS. 1, 6, and 7, an ion implantation process 30 is performed on the semiconductor substrate 10 and the active regions 25. The ion implantation process 30 uses the device isolation layer 20 as a self-aligned mask to form impurity diffusion regions 34 and 38 in the semiconductor substrate 10 and the active regions at the same time, respectively. The impurity diffusion regions 34 and 38 are preferably implanted with P type impurity ions. A projection range Rp of the ion implantation process 30 is preferably set so as to form the impurity diffusion regions 38 below the device isolation layer 20 in the semiconductor substrate. The projection range Rp of the ion implantation process 30 indicates the approximate center of distribution of the impurity ions. Accordingly, impurity concentrations of the impurity diffusion regions 34 in the active regions 25 become different from those of the impurity diffusion regions 38 in the semiconductor substrate 10. The impurity concentrations of the impurity diffusion regions 34 in the active regions 25 are preferably lower than those of the impurity diffusion region 38 in the semiconductor substrate 10. The impurity diffusion regions 38 in the semiconductor substrate 10 may help to electrically isolate the active regions 25.

Figure 8:
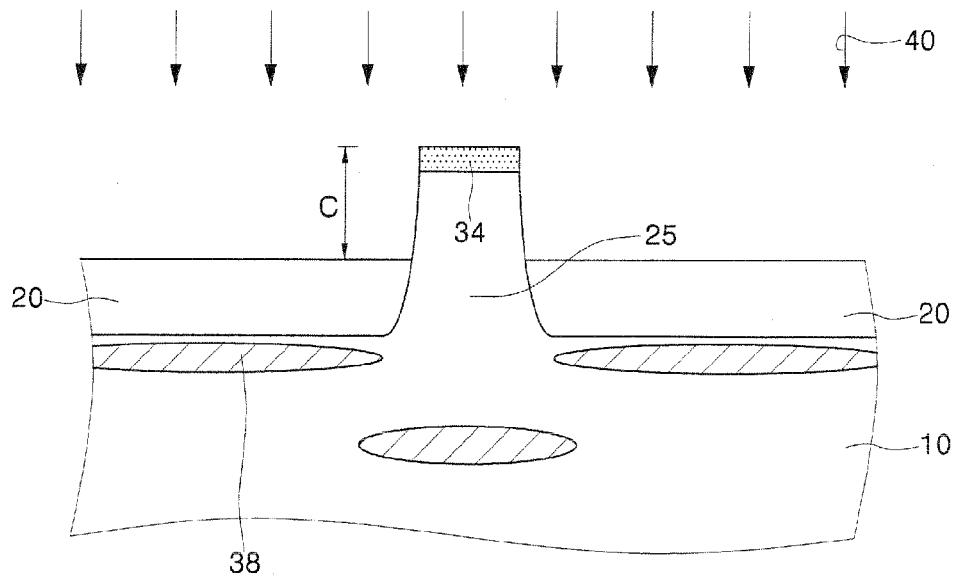
Figure 9:
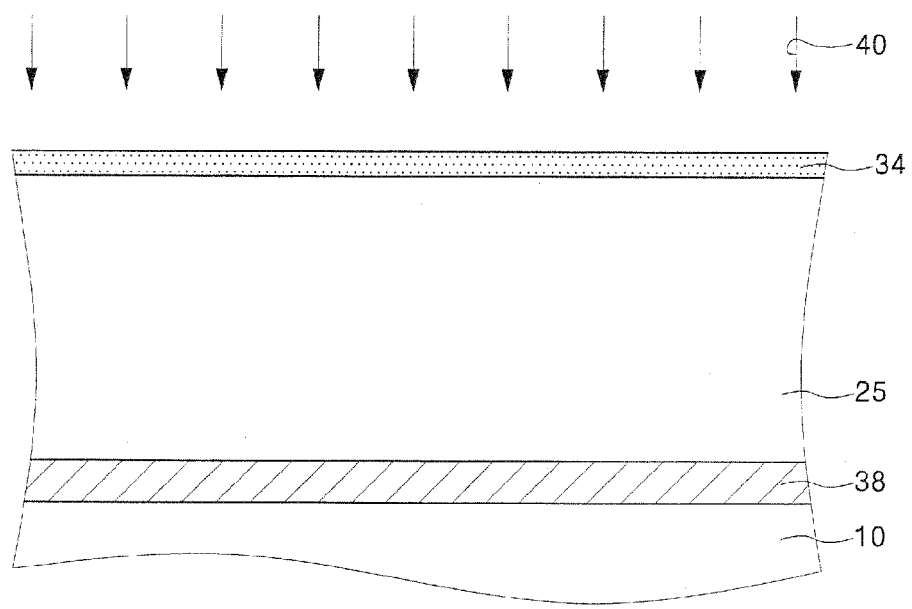

Referring to FIGS. 1, 8, and 9, an etching process 40 is performed on the device isolation layer 20 using the semiconductor substrate 10 as an etch mask. The etching process 40 removes a portion of the device isolation layer 20 so that the top surface of the device isolation layer 20 is located below the top surfaces of the active regions 25 by a predetermined depth C. Because of this etching process 40, portions of the sidewalls of the active regions 25 are exposed, as the top surfaces of the active regions 25 may be higher than a top surface of the device isolation layer 20. The active region 25 protruded from the top surface of the device isolation layer 20 may act as a thin body of a transistor with a vertical channel. The etching process 40 may be performed by using a dry etching or wet etching technique.

Figure 10:
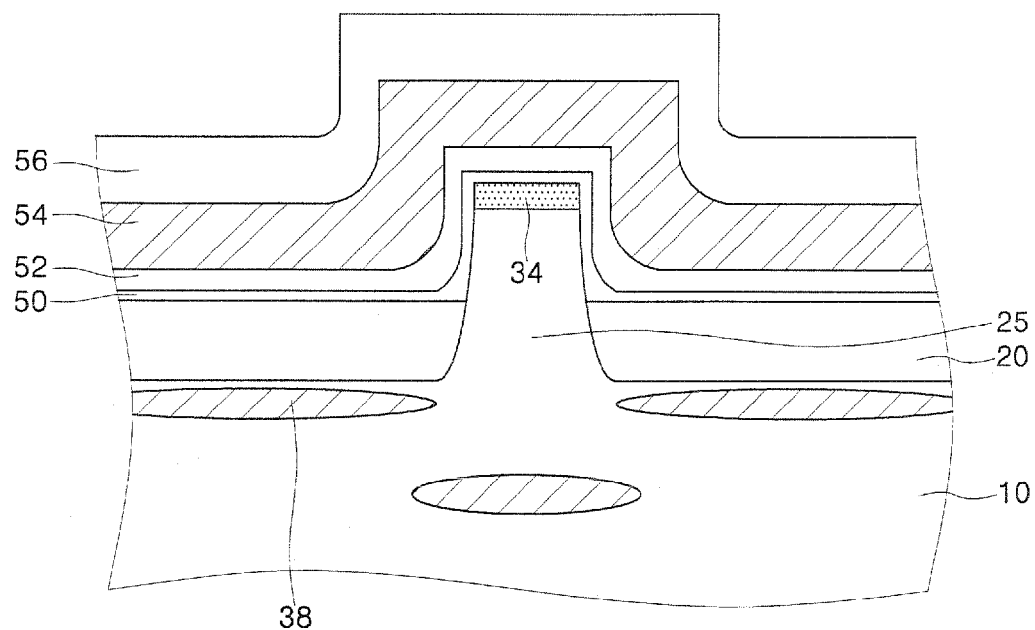
Figure 11:
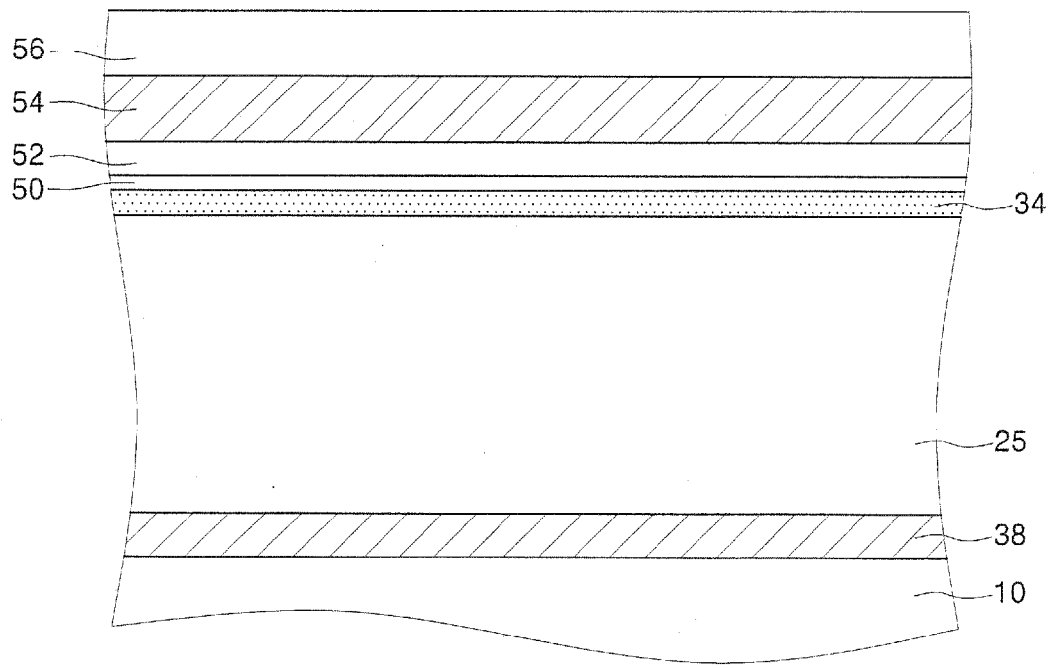

Referring to FIGS. 1, 10, and 11, a gate insulating layer 50 is formed on the semiconductor substrate 10 to cover the device isolation layer 20 and the active regions 25. The gate insulating layer 50 is preferably formed of a silicon oxide layer, a silicon oxynitride layer, or a silicon nitride layer. Polysilicon layers 52 and 54 and a gate capping layer 56 are then sequentially deposited on the gate insulating layer 50. The polysilicon layers 52 and 54 preferably have different impurity concentrations from each other. To this end, the polysilicon layer 52 in contact with the gate insulating layer 50 preferably does not have impurity ions, while the polysilicon layer 54 above the gate insulating layer 50 preferably does have impurity ions. The polysilicon layer 54 may have $P^+$ type impurity ions. The gate capping layer 56 is preferably formed of a silicon nitride layer or a silicon oxide layer.

Alternatively, each of the polysilicon layers 52 and 54 may have impurity ions resulting from the performance of a deposition process. In this case, the impurity concentration of the polysilicon layer 52 is preferably lower than that of the polysilicon layer 54. To this end, the polysilicon layer 52 may have P− type impurity ions, and the polysilicon layer 54 may have P+ type impurity ions.

In the meantime, the polysilicon layer 52 preferably has an amorphous structure, while the polysilicon layer 54 preferably has a crystalline structure. This is to minimize the diffusion of the impurity ions from the polysilicon layer 54 into the active regions 25. In addition, the thickness of the polysilicon layer 52 is preferably different from that of the polysilicon layer 54.

Figure 12:
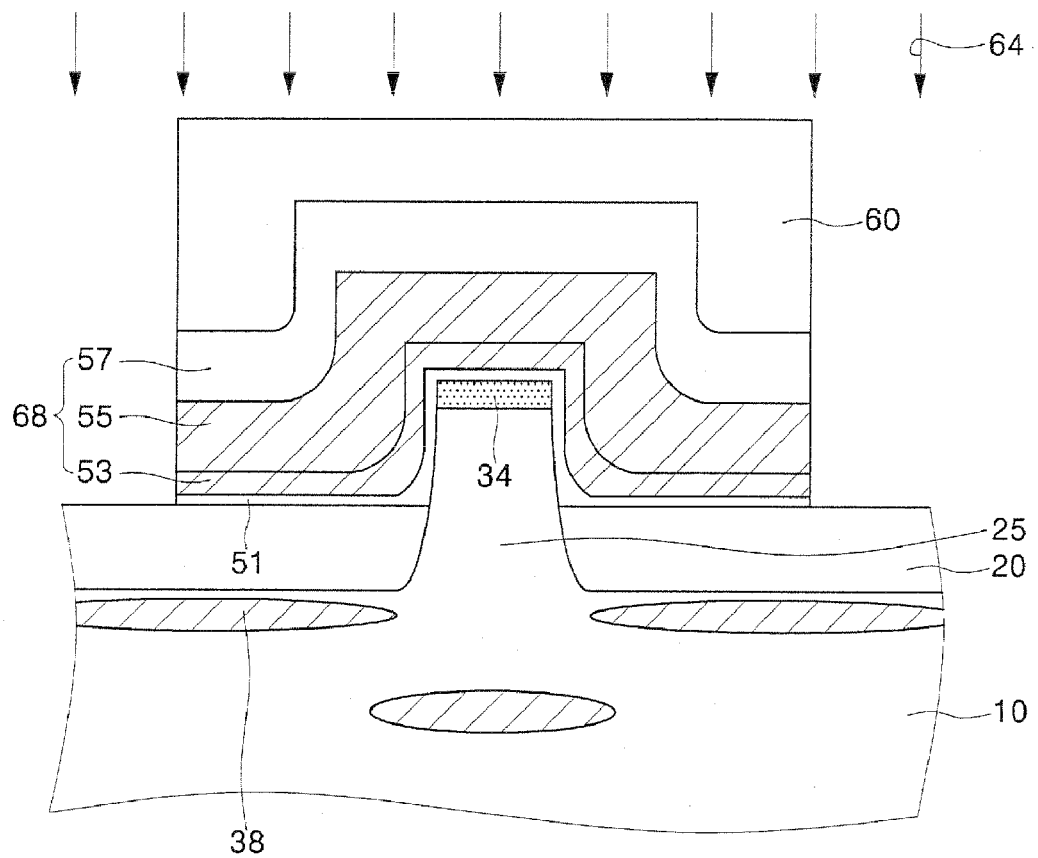
Figure 13:
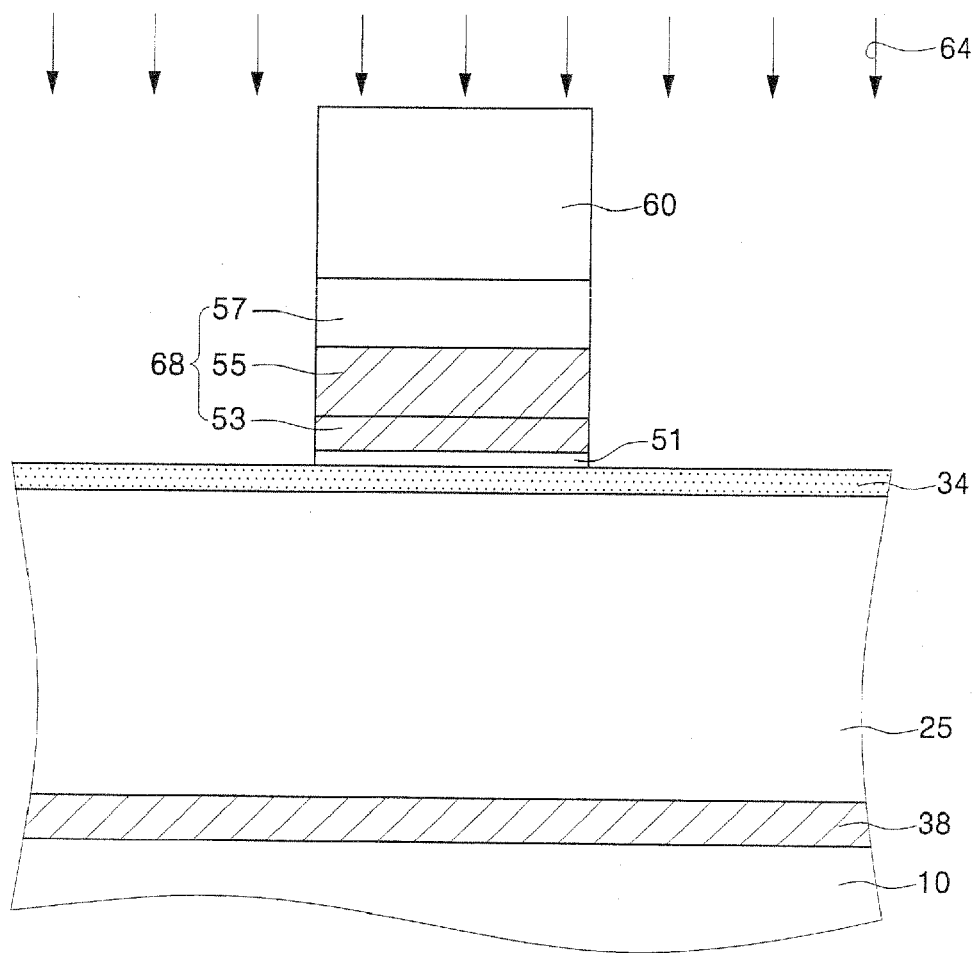

Referring to FIGS. 1, 12, and 13, photoresist patterns 60 are formed on predetermined regions of the polysilicon layer 54, respectively. An etching process 64 is sequentially performed on the gate capping layer 56, the polysilicon layers 54 and 52, and the gate insulating layer 50 using the photoresist patterns 60 as an etch mask. The etching process 64 exposes a portion of each of the active regions 25. As a result of this etching process 64, gate patterns 68 and gate insulating patterns 51 are formed below the photoresist patterns 60. Each of the gate patterns 68 includes polysilicon patterns 53 and 55 and a gate capping pattern 57, which are sequentially stacked.

In the meantime, the gate patterns 68 of FIG. 10 or 11 may allow the impurity ions of the polysilicon patterns 54 to be diffused into the polysilicon patterns 52 during the etching process. In this case, the resulting impurity concentrations of the polysilicon patterns 53 and 55 in FIG. 12 or 13 may be higher than those of the impurity diffusion regions 34 of the active regions 25.

Figure 14:
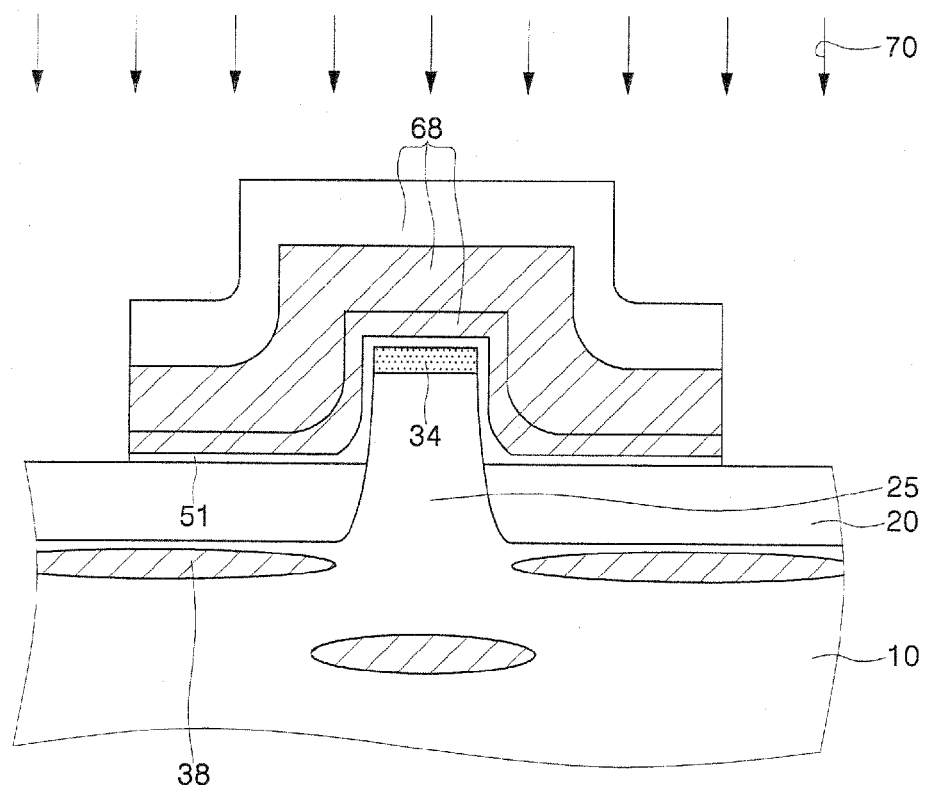
Figure 15:
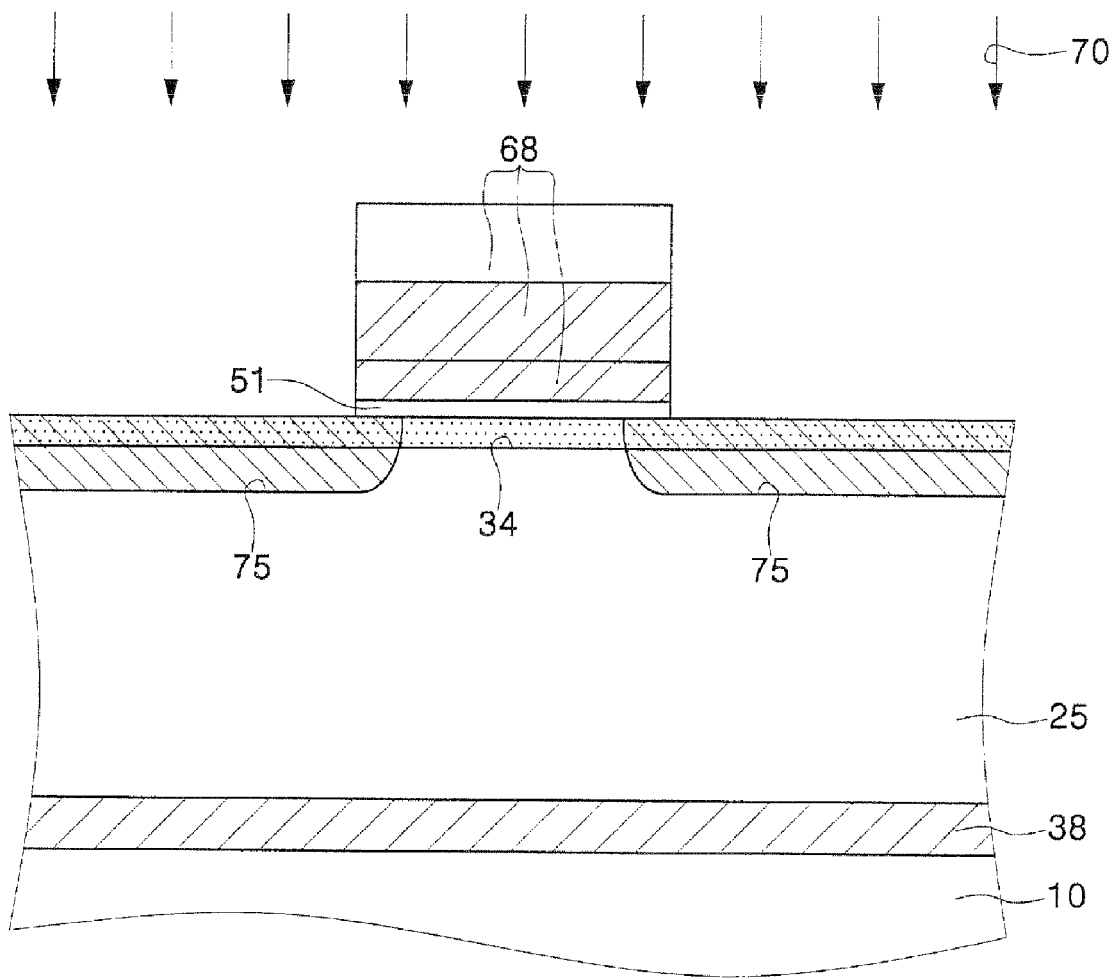

Referring to FIGS. 1, 14, and 15, the photoresist patterns 60 are removed from the semiconductor substrate 10. An ion implantation process 70 is performed on the semiconductor substrate 10 using the gate patterns 68 and the gate insulating patterns 51 as implantation masks. The ion implantation process 70 forms first impurity regions 75 in the active regions 25, where the first impurity regions 75 preferably overlap the gate patterns 68. Each of the first impurity regions 75 may have $N^-$ type impurity ions.

Figure 16:
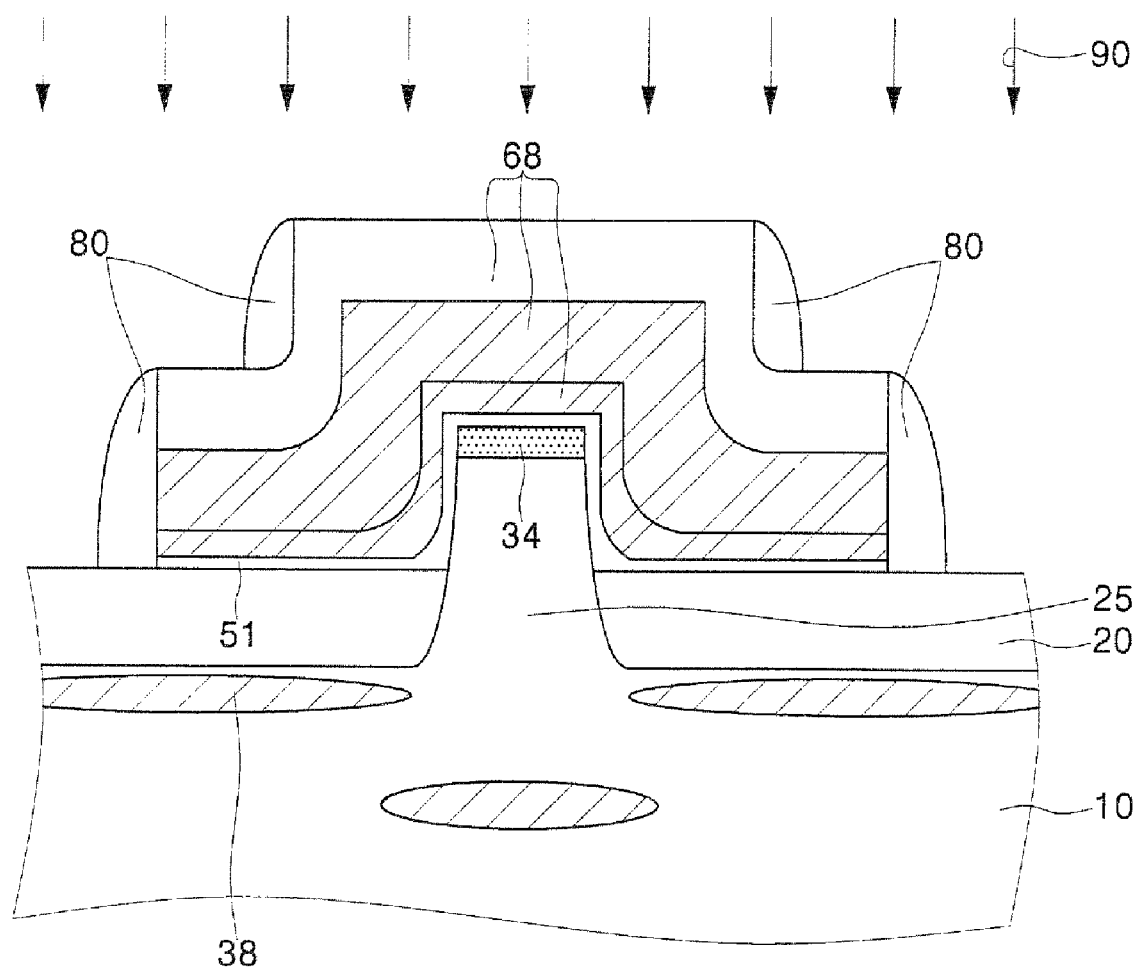
Figure 17:
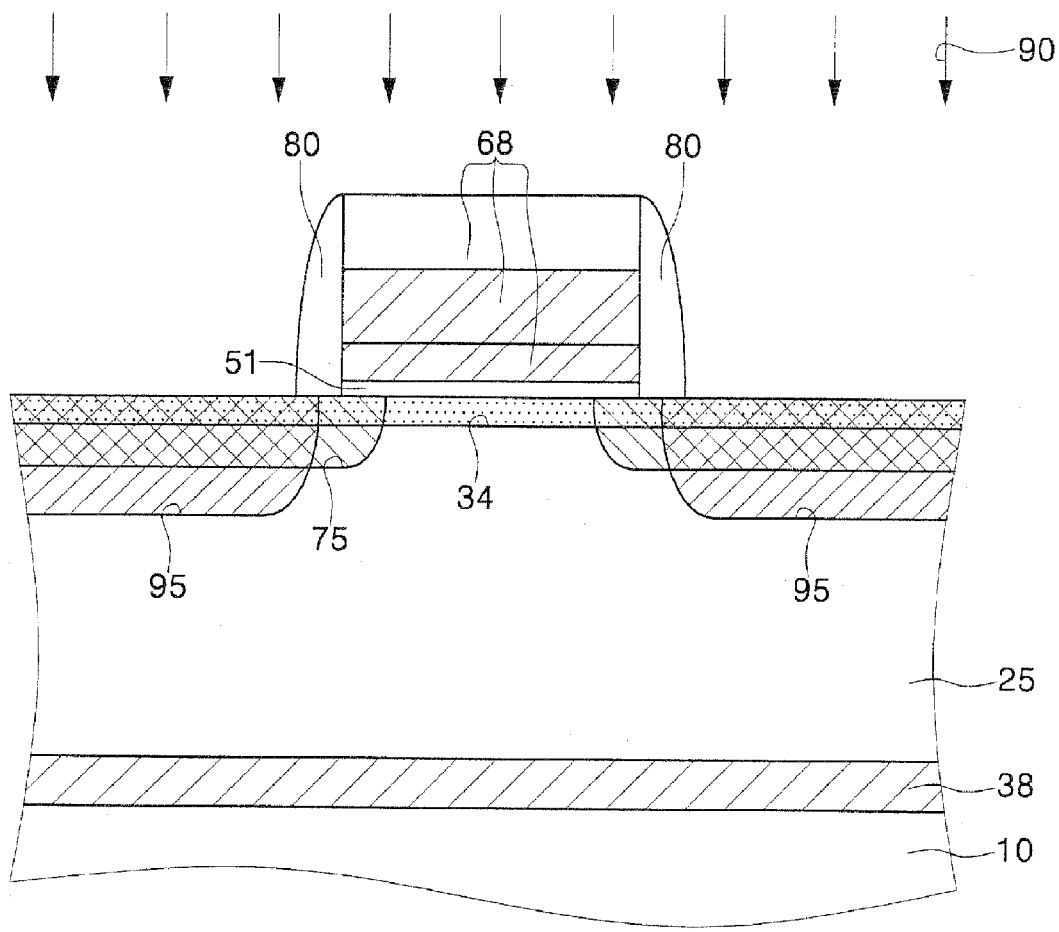

Referring to FIGS. 1, 16, and 17, gate spacers 80 are formed on sidewalls of the gate patterns 68 and the gate insulating patterns 51. The gate spacers 80 are preferably formed of silicon oxide or silicon nitride. A second ion implantation process 90 is performed on the active regions 25 using the gate spacers 80 and the gate patterns 68 as implantation masks. The ion implantation process 90 forms second impurity regions 95 in the active regions 25, where the second impurity regions 95 also preferably overlap the gate spacers 80. The second impurity regions 95 may have $N^+$ type impurity ions.

Figure 18:
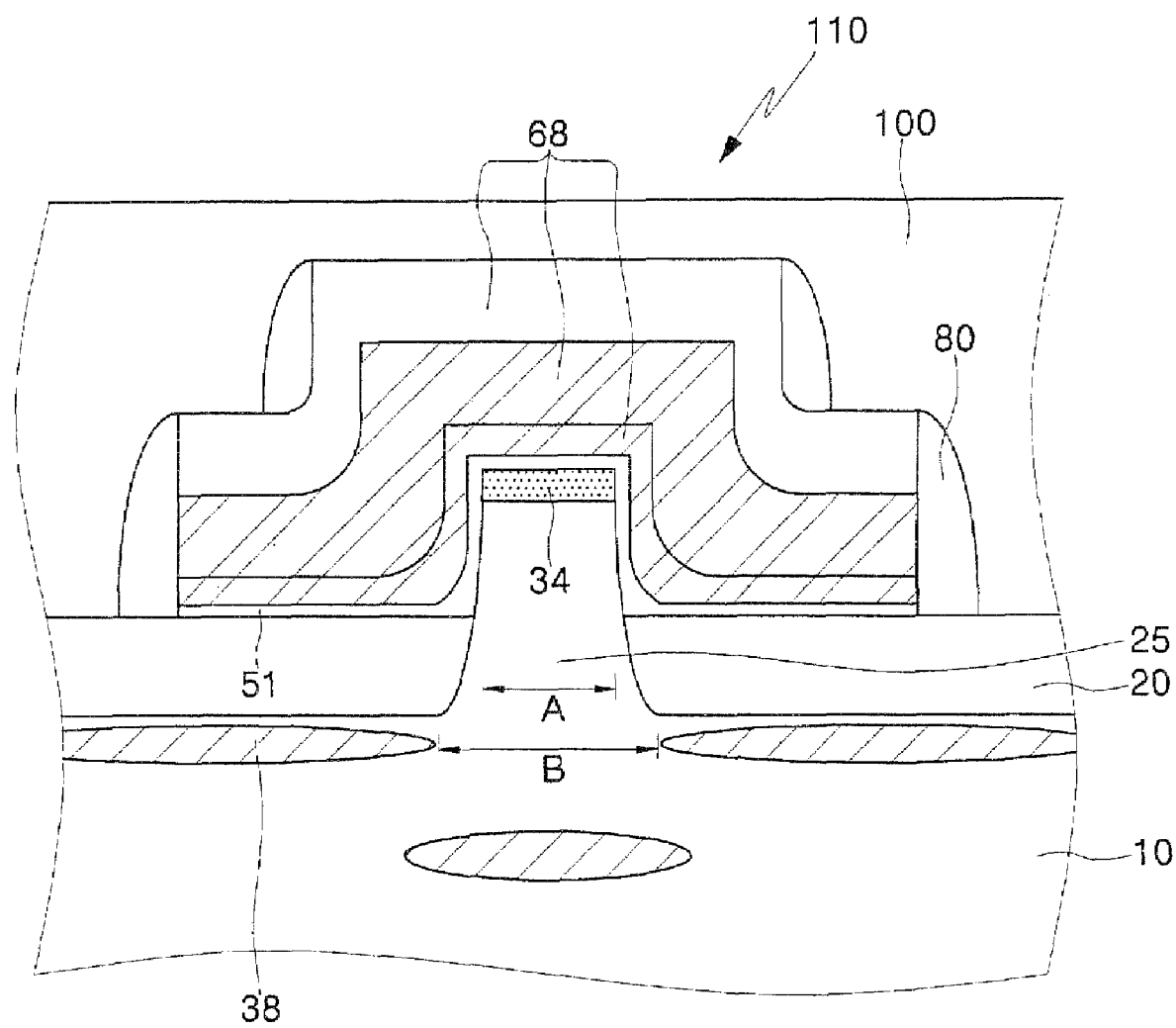
Figure 19:
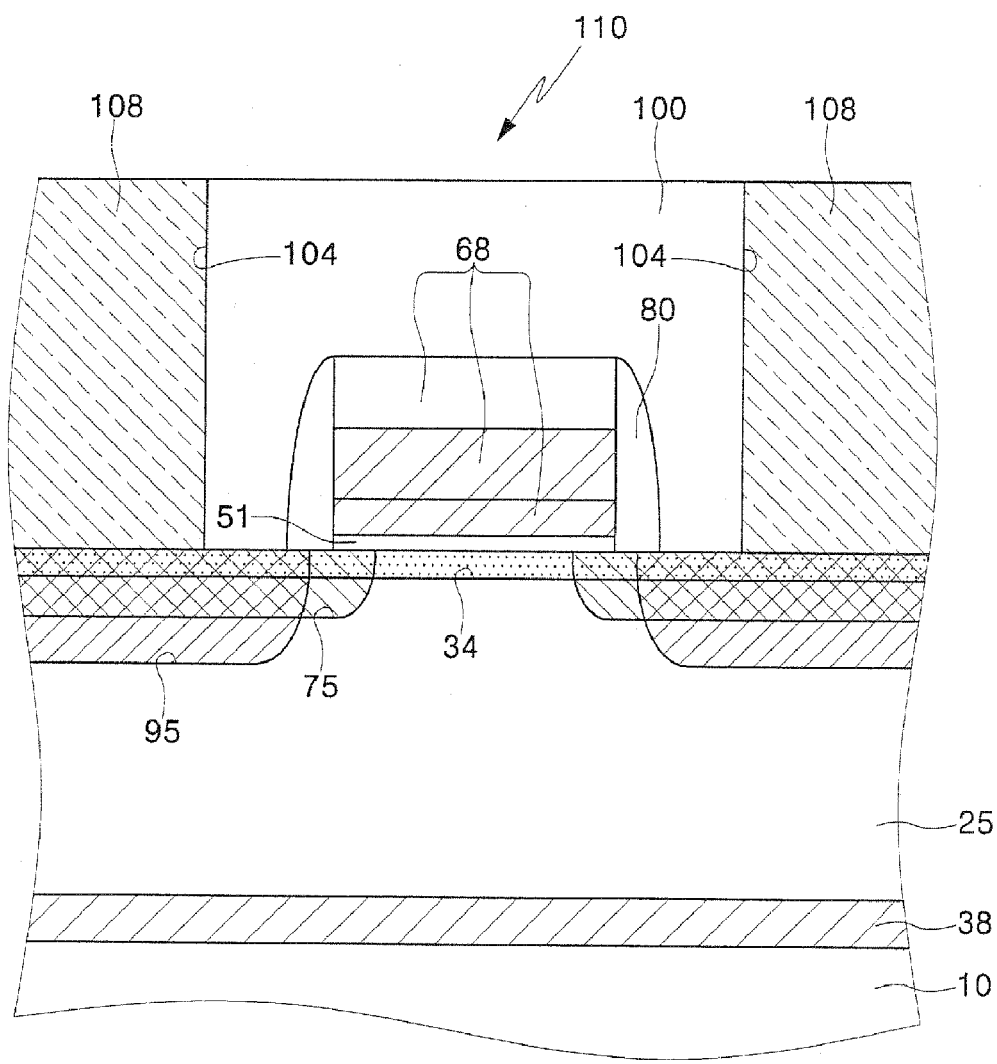

Referring to FIGS. 1, 18, and 19, an interlayer-insulating layer 100 is formed on the semiconductor substrate 10 to cover the gate spacers 80 and the gate patterns 68. Contact holes 104 are formed in the interlayer-insulating layer 100. The contact holes 104 preferably expose the first and second impurity regions 75 and 95 adjacent to the gate patterns 68. Subsequently, contact nodes 108 are formed in each of the contact holes 104 so that the contact nodes 108 fill the contact holes 104, respectively. The contact nodes 108 are preferably formed of conductive layers. Accordingly, double gate transistors 110 including contact nodes 108, gate patterns 68, and first and second impurity regions 75 and 95 are formed in the semiconductor memory device 120.

Each of the double gate transistors 110 can easily adjust a threshold voltage even when the top and bottom widths of the active region 25 continuously decrease due to the high integration of the semiconductor memory device 120. This is because of the following.

First, when the top and bottom widths A and B of the active region 25 decrease to 50 nm or less, a conventional double gate transistor (not shown) has a P type impurity concentration of the active region corresponding to about $10E15 \sim 10E17/cm^3$, an N+ type impurity concentration of a gate pattern, and a threshold voltage of about −0.3V or less during its drive. The threshold voltage of the conventional double gate transistor is a value which is experimentally or theoretically well known. In practice, the conventional double gate transistor consumes a large amount of driving power so that it can degrade the electrical characteristics of the semiconductor memory device when the threshold voltage needs to be kept to a value of about 0.9V or more.

According to the present invention, however, when the top and bottom widths A and B of the active region 25 are decreased to about 50 nm or less, the double gate transistor 110 may have a P type impurity concentration of the active region 25 corresponding to about $10E15 \sim 10E17/cm^3$, a P+ type impurity concentration of the gate pattern 68, and a threshold voltage of about 0.9V or more during its drive. This is possible because the double gate transistor 10 is driven using the gate pattern 68 having the $P^+$ type impurity ions instead of the gate pattern having $N^+$ type impurities. That is, the double gate transistor 110 can have a threshold voltage of 0.9V or more using a work function difference ($\Phi_{ms}$) between the gate pattern 68 and the active region 25. This can be summarized as shown in the following table (Table 1).

TABLE 1

| Conductivity type of the gate pattern | Work function | Threshold voltage | Equation of the threshold voltage |
|---|---|---|---|
| N+ | 4.05 | −0.3 V or less | $V_{th} = \Phi_{ms} + V_0 + \Phi_s + (qQ_f/C_0)$ |
| P+ | 5.17 | +0.9 V or more | |

The present invention does not include an ion implantation process for adjusting the threshold voltage. Accordingly, the double gate transistor 110 secures a stable threshold voltage using a work function of the gate pattern, which thus increases the mobility of charges during its drive. The increase in mobility of charges can lead to enhancement of current drivability of the semiconductor memory device 120.

As described above, the present invention provides double gate transistors having at least two polysilicon patterns on the thin body used as the active region and having a stable threshold voltage. Accordingly, the double gate transistors can enhance the electrical characteristics of the semiconductor memory device.

Exemplary embodiments of the present invention have been disclosed herein and, although specific terms are employed, they are used and are to be interpreted in a generic and descriptive sense only and not for the purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   an active region formed to protrude above a device isolation layer in a semiconductor substrate, the active region having a top surface and sidewalls;
   a gate insulating pattern disposed on the device isolation layer and the active region so as to cover the top surface and a portion of the sidewalls of the active region; and
   a gate pattern disposed on the gate insulating layer over the active region, the gate pattern including a first polysilicon pattern and a second polysilicon pattern, where the first polysilicon pattern has a different crystalline structure than the second polysilicon pattern.

2. The semiconductor device according to claim 1, wherein the first polysilicon pattern has different thicknesses than the second polysilicon pattern.

3. The semiconductor device according to claim 1, wherein the first polysilicon pattern is in contact with the active region and has an amorphous structure, and the second polysilicon pattern has a crystalline structure.

4. The semiconductor device according to claim 1, further comprising:
   at least one first impurity diffusion region formed in the active region and at least one second impurity diffusion region formed below the device isolation layer, wherein an impurity concentration of the first impurity diffusion region is lower than impurity concentrations of the first and second polysilicon patterns.

5. A semiconductor memory device having a double gate transistor, comprising:
   a semiconductor substrate having a cell array region;
   a device isolation layer defining active regions in the cell array region, the active regions protruded from the semiconductor substrate to be higher than a top surface of the device isolation layer formed in the cell array region;
   gate patterns disposed in the active regions; and
   gate insulating patterns respectively disposed below the gate patterns, and covering top surfaces and portions of sidewalls of the active regions,
   wherein each of the gate patterns includes sequentially stacked polysilicon patterns, and the polysilicon patterns have different crystalline structures from each other.

6. The semiconductor memory device according to claim 5, wherein the polysilicon patterns have different thicknesses from each other.

7. The semiconductor memory device according to claim 5, wherein the polysilicon patterns in contact with the gate insulating patterns have amorphous structures, respectively, and the remaining polysilicon patterns have crystalline structures, respectively.

8. The semiconductor memory device according to claim 5, further comprising:
   impurity diffusion regions formed in the active regions below the gate insulating patterns and in the semiconductor substrate below the device isolation layer,
   wherein the impurity diffusion regions have different impurity concentrations from each other, impurity concentrations of the impurity diffusion regions in the active regions are lower than impurity concentrations of the polysilicon patterns, and the polysilicon patterns, the impurity diffusion regions, and the semiconductor substrate have P type impurity ions.

9. A semiconductor device comprising:
   an isolation layer formed in a semiconductor substrate to define an active region having a top surface and sidewalls, the active region formed to protrude above the isolation layer;
   at least one first impurity diffusion region formed in the active region and at least one second impurity diffusion region formed below the device isolation layer;
   a gate insulating pattern disposed on the device isolation layer and the active region to as to cover the top surface and a portion of the sidewalls of the active region; and
   a gate pattern disposed on the gate insulating layer over the active region, the gate pattern including a first polysilicon pattern, a second polysilicon pattern, and a gate capping pattern, where the first polysilicon pattern has a different impurity concentration and a different crystalline structure than the second polysilicon pattern.

10. The semiconductor device of claim 9, wherein the first polysilicon pattern has an amorphous structure, and the second polysilicon pattern has a crystalline structure.

* * * * *

UNITED STATES PATENT AND TRADEMARK OFFICE
CERTIFICATE OF CORRECTION

PATENT NO. : 7,557,403 B2  
APPLICATION NO. : 11/379432  
DATED : July 7, 2009  
INVENTOR(S) : Dae-Won Ha Page 1 of 1

It is certified that error appears in the above-identified patent and that said Letters Patent is hereby corrected as shown below:

Column 5, line 37, the word "FIG." should read -- FIGS. --;  
Column 6, line 31, the word "10" should read -- 110 --.

Signed and Sealed this

Sixth Day of October, 2009

David J. Kappos  
*Director of the United States Patent and Trademark Office*